United States Patent

Broder et al.

[11] Patent Number: 6,088,039
[45] Date of Patent: *Jul. 11, 2000

[54] COMPRESSION OF GREY SCALE IMAGES OF TEXT

[75] Inventors: Andrei Zary Broder, Menlo Park; Michael David Mitzenmacher, Palos Verdes Estates, both of Calif.

[73] Assignee: Compaq Computer Corporation, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/582,711

[22] Filed: Jan. 4, 1996

[51] Int. Cl.[7] .................................................. G06T 9/00
[52] U.S. Cl. ........................ 345/432; 348/420; 358/539; 358/433; 382/166; 382/194; 382/246
[58] Field of Search .................................. 395/131, 132; 382/166, 194, 237, 244, 246; 358/539, 261.3, 426, 433; 348/420, 384; 345/431, 432

[56] References Cited

U.S. PATENT DOCUMENTS

| | | | |
|---|---|---|---|
| 4,783,841 | 11/1988 | Crayson | 382/56 |
| 5,408,542 | 4/1995 | Callahan | 382/56 |
| 5,452,104 | 9/1995 | Chong | 358/433 |
| 5,481,364 | 1/1996 | Ito | 358/261.1 |

*Primary Examiner*—Mark K. Zimmerman
*Attorney, Agent, or Firm*—Leah Sherry; Oppenheimer Wolff & Donnelly LLP

[57] ABSTRACT

An image stored in a memory of a computer as pixels, each pixel including a bit pattern to indicate a grey-scale level. The image is compressed by grouping the pixels of the image into a plurality of regularized groups of pixels. The partitioning of the image can be in groups of four by four adjacent pixels. Groups of pixels having identical bit patterns are identified. The groups of pixels are encoded according to a frequency of groups of pixels having identical bit patterns.

19 Claims, 6 Drawing Sheets

COMPRESSION OF GREY SCALE IMAGES OF TEXT

FIELD OF THE INVENTION

This invention relates generally to compressing data, and more particular to compressing data representing grey-scale images of text

BACKGROUND OF THE INVENTION

With modem computer systems, it is now a common practice to present images, such as pages of text, with a computer system. For example, the pages can be pages of books, or "pages" of information obtained via a communication network such as the Internet. Users of the computer systems may desire to view a large number of images. These images can consume large amounts of memory storage. It is desired to reduce the storage required for digital images. Compressed images can be processed and communicated in less time.

Typically, the images are stored as pixel elements, each pixel element indicates the level of illumination, or blackness on paper that should be used during the rendering of the element on a display screen. If four levels of grey-scale are used, then each pixel consumes 2 bits.

Since the data typically need to be compressed only once prior to subsequent repeated use, the time required to compress the pixel data is of minor concern. However, decompressing an encoded page of text should take no longer than turning a real page.

In addition, it is desired to compress images which are to be displayed using anti-aliasing techniques. For example, frequently a scanned image includes 300 dots per inch (dpi). However, many display systems can only display pixels at resolutions of 100 dpi. Displaying lines which are slanted with respect to the orientation of the pixels usually results in a jagged or step-like appearance. Anti-aliasing uses an intermediate level of the grey-scale to "smooth" the jagged appearance of the lines.

Prior art techniques for compressing images, such as JPEG for moving pictures, are generally too slow and coarse for recovering and rendering quality text images in a relatively short time. For example, decompression should take no more than a couple of seconds per page. Compression schemes developed for digitized facsimiles are more appropriate. Typical facsimile (FAX) compression schemes can reach an eight to one 8:1 compression ratio.

In the prior art, two types of compression techniques are known for bi-level or two-tone (black and white) images of text The techniques are either pixel based or mark (character) based. Pixel based techniques include JBIG, FELICS, and MGBILEVEL. These schemes consider and encode each pixel individually. For example, the shade of each pixel is encoded according to the shades of the surrounding pixels.

Mark based schemes attempt to derive or infer the original marks or characters from the image of the text. Schemes based on marks, such as MGTIC, typically store information regarding mark boundaries identified with derived or provided font information. In other words, with character based compression, the text is partitioned according to a shape of the underlying characters which form the text. Mark based systems tend to be relatively inefficient All of these bi-level techniques are described in "Managing Giagabyte: Compressing indexed documents and text," Moffat and Bell, Van Nostrand Reinhold, 1994.

It is desired to provide a compression scheme for grey-scale text images which yields a compression ratio at least as good, if not better than what is known in the prior art. Furthermore, it is desired that the time required to decompress the encode data be reduced during rendering of the images.

SUMMARY OF THE INVENTION

In a computerized method for compressing an image, the image is stored as pixels in a memory of a computer. Each pixel includes a bit pattern indicating a grey-scale level. The pixels are partitioned into regularized groups of adjacent pixels. Groups of pixels having identical bit patterns are identified and counted. The groups having identical bit patterns are encoded into encodings according to a frequency of identical groups. In a preferred embodiment of the invention, the partitioning of the pixels is into rectangular groups of sixteen pixels.

In an alternative embodiment of the invention, bit pattern representing white space, e.g., all bits of the pattern set to a logical zero, are encoded using run-length encoding. The encodings can be further compressed by encoding the differences between the integer values represented in the encoding.

Additionally, a substitute encoding can be selected to represent an infrequently occurring group of pixels. In this case, the substitute encoding represents a particular group of pixels having bit patterns substantially the same as the infrequently occurring group of pixels to achieve lossy compression. This method can be converted to a lossless compression by encoding a difference between the infrequently occurring group of pixels and the particular group of pixels.

BRIEF DESCRIPTION OF THE DRAWINGS

FIG. 1b is diagram of digitized data of an image to be compressed by the process of FIG. 1a;

DETAILED DESCRIPTION OF THE PREFERRED EMBODIMENT

The present invention discloses a compression scheme which is based on neither the pixel nor the mark schemes of the prior art, described above. The method of the present invention is particularly applicable for compressing grey-scale images of text. In the inventive method, patterns are recognized in simple groupings of pixels. The compression scheme of the present invention achieves compression ratios at least as good, or better than most known compression schemes for images of text while reducing the time required to decompress for rendering.

Figure 1A:
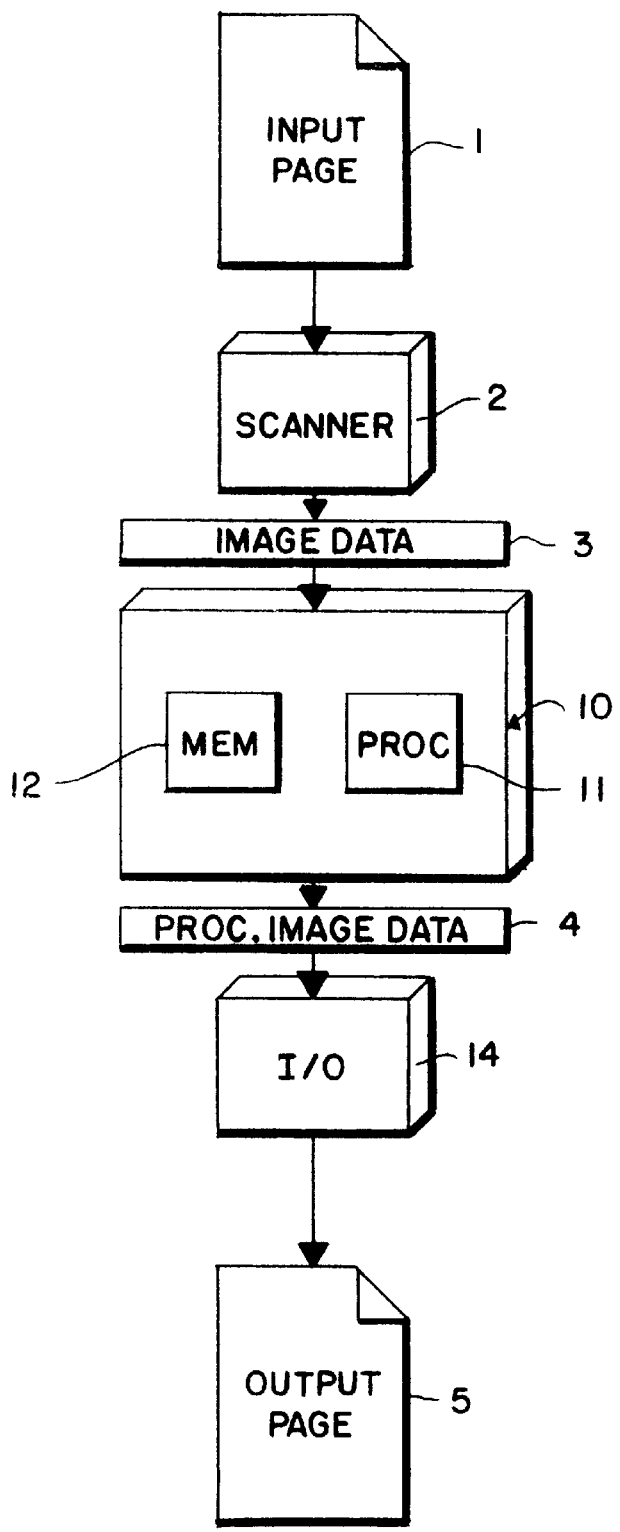
FIG. 1a is flow diagram of a process for compressing and decompressing images which can use the invention.

Now with reference to the drawings, FIG. 1a shows an input page 1 which can be digitized by a scanner 2 or A/D convertor. The digitized representations, e.g., image data 3 of the input page 1, are processed by a computer system 10 according to the principles of the invention. While the image data 3 are processed by a processor 11, the data 3 are stored in a memory 11 of the computer system 10. After manipulation by the computer system 10, processed image data 4 can be converted by an I/O rendering sub-system 14 including, for example, a display terminal, a printer, a network browser, or the like, to render an output page 5.

Figure 1B:
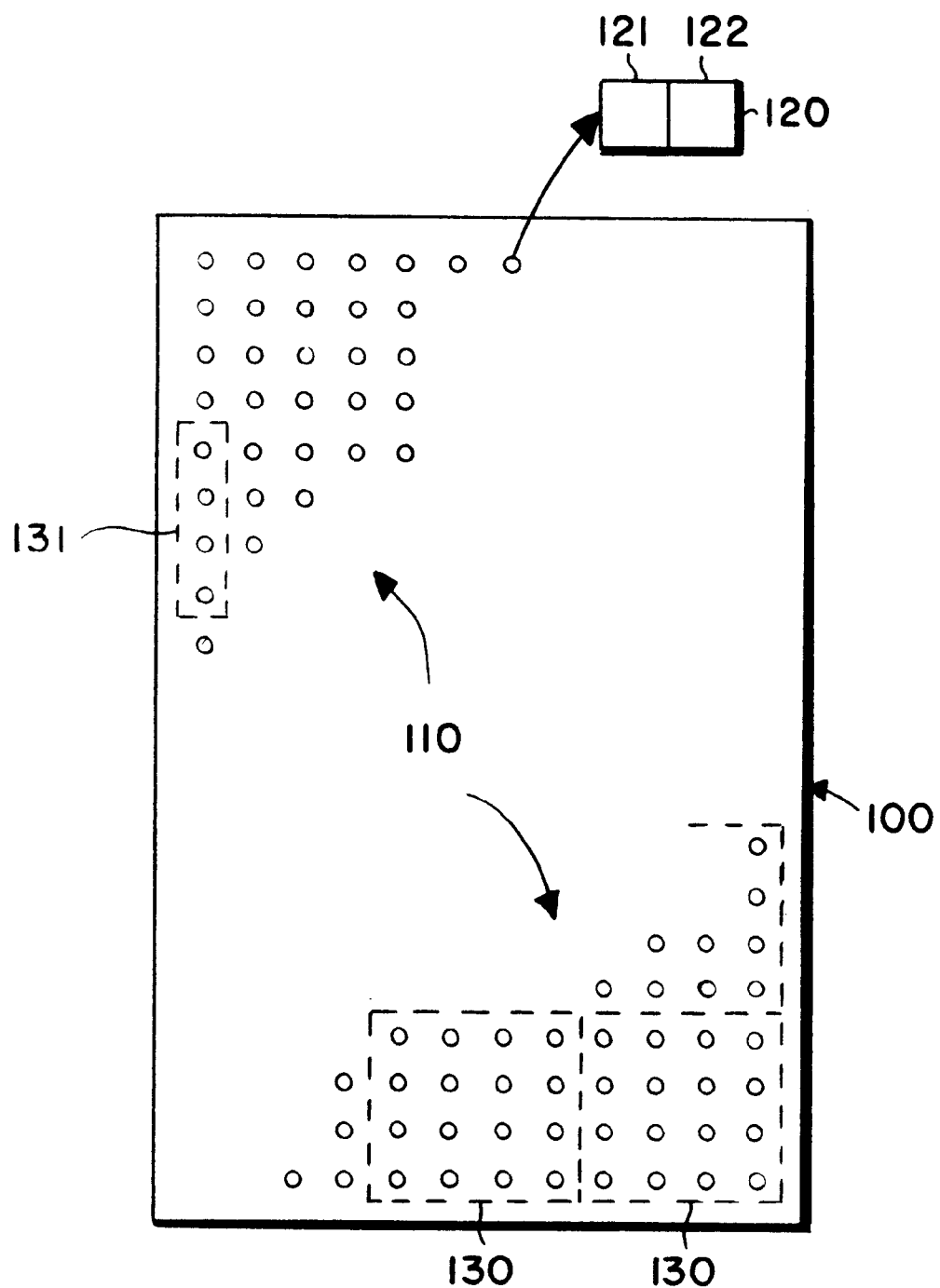

FIG. 1b shows a digitized image 100 representing the image data 3. The image 100 is operated on by a process 200 of FIG. 2. The process 200 can be in the form of a computer implemented software program operating on data structures stored in the memory 12 of FIG. 1a. The process 200 is used to compress pixel data of the image 100 according to the preferred embodiment of the invention. The digitized image 100 represents, for example, text of the input page 1. The text can be composed of characters or other marks. The arrangement of the grey levels of the pixels defines the shape of the marks.

Typically, if the image 100 represents text, then most of the marks are arranged in lines or columns separated by white space. In addition, the text is usually surrounded by margins of white space. However, it should be understood that the invention can also be worked with marks arranged randomly on the page. The marks can be stylized by one or more fonts, although the invention can also process marks which are not members of known font sets.

The digitized image 100 can be stored in the memory of the computer system along with a large number of other similar images. The digitized image 100 includes a plurality of pixels 110. Each of the pixels 110 is stored as a bit pattern 120 indicating the grey-scale level to be used when rendering the digitized image 100. For example, each bit pattern 120 can include two bits 121 and 122. With two bits, four levels of grey-scale can be indicated, e.g., 00, 01, 10, and 11. Typically, the pixels 110 are arranged in a regularized pattern in the memory 12 of FIG. 1a. The regularized pattern being generally independent of the shape of the underlying marks. For example, the coordinates of the pixels can be mapped into a Cartesian grid.

Figure 2:
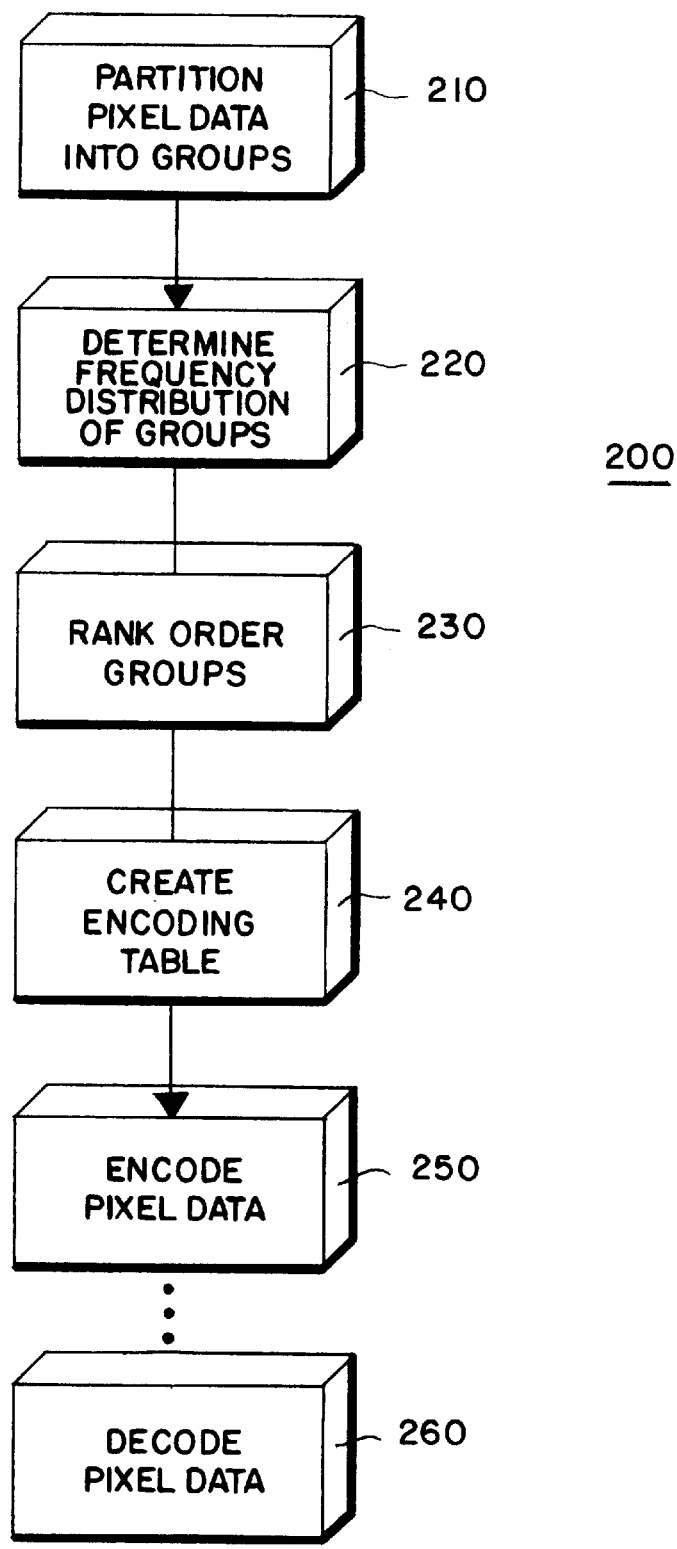
FIG. 2 is a flow diagram of the process for compressing grey-scale images according to a preferred embodiment of the invention.

The idea of the invention is to use the process 200 of FIG. 2 to capture mark information from the uncompressed pixel data 3 of the image 100 in the form of a simple font set. In step 210, the font set is created by partitioning the two-dimensional array of pixels 110 representing the entire digitized image 100 into a plurality of small regularized groups 130. For example, each group 130 includes sixteen neighboring pixels.

This means that orthogonally adjacent pixels 110 are organized into groups of four by four pixels. Each group 130 including 32 bits, e.g., 16×2 bits of four level grey-scale data. Depending on the size and shape of the underlying text, the partitioning of the pixels can use other groupings, for example, groups of 8×8 pixels, groups of 1×4 pixels, and so forth. For 100 dpi grey-scale images, groups of 4×4 have been found to be the most effective.

Because the partitioning of the image 100 by the present invention is regularized according to the arrangement of the pixels 110, and not the underlying marks as in the prior art, the abstract font set created here is independent of the types of fonts that are typically used to stylize characters in the prior art. Thus, as an advantage, the invention can be used with any type of marking on the page.

In addition, the groups 130 are simple and small, e.g., thirty-two bits. Therefore, the groups can be conveniently handled by most modem computer systems. Compression can be performed in a reasonable amount of time, and decompression can be accelerated over known methods.

In step 220, a frequency distribution is determined for the various bit patterns of the groups 130. The frequency distribution can be determined by identifying sets of groups having identical bit patterns, and counting the number of member groups in each set. This step can be performed while making a single pass through the pixel data of the image 100.

In step 230, the sets of groups are arranged in rank order. This means that sets having a larger number of member groups are ranked before sets having a fewer number of member groups. The frequency distribution of the bit patterns of the groups 130 forms the basis for creating an encoding table in step 240. In the preferred embodiment of the invention, the encoding is in the form of Huffman encoding. Huff-man encoding is well known in the art, see for example, D. Knuth, *Fundamental Algorithms,* Knuth, Addison Wesley, 1969, pp. 402–405.

In a Huff-man encoding table, groups of frequently occurring bit patterns are encoded with a small number of bits, and groups of occasional patterns consume more bits in their encode form. This means that the number of bits assigned to a particular encoding is inversely proportional to the frequency of the groups they represent. In addition, any particular code can not be the prefix of another code. The entries of the Huffman table can be maintained in a linear list in the order of the frequency distribution to minimize search time during encoding and decoding.

In step 250, the Huffman encoding table is used to encode the pixel data of the image 100. As a further advantage, during the encoding step 250, the invention recognizes that in images representing pages of text, the most frequently occurring "marks" represent white space. Therefore, white space, e.g., adjacent groups of pixels with all bits set to a logical zero, can be encoded using run-length compression techniques. In runlength compression techniques, the mark and the number of successive occurrences of the mark are encoded.

Note that the Huffman table does not need to encode every possible bit pattern of the groups 130. For example, infrequently occurring patterns or "marks" can simply be left in their unencoded form. The number of infrequently occurring marks which are excluded from the Huffman table can be used to determine the size of the table. If the size of the table is kept small, then decoding latencies can be improved since it will take less time to transmit the table to a remote processing site, and the time required to search the table during decoding is also reduced.

Subsequently, in step 260, the Huffman encoding table can be used to decode the compressed data to create the output page 5 using, for example, the I/O rendering sub-system 14 of FIG. 1a.

Figure 3:
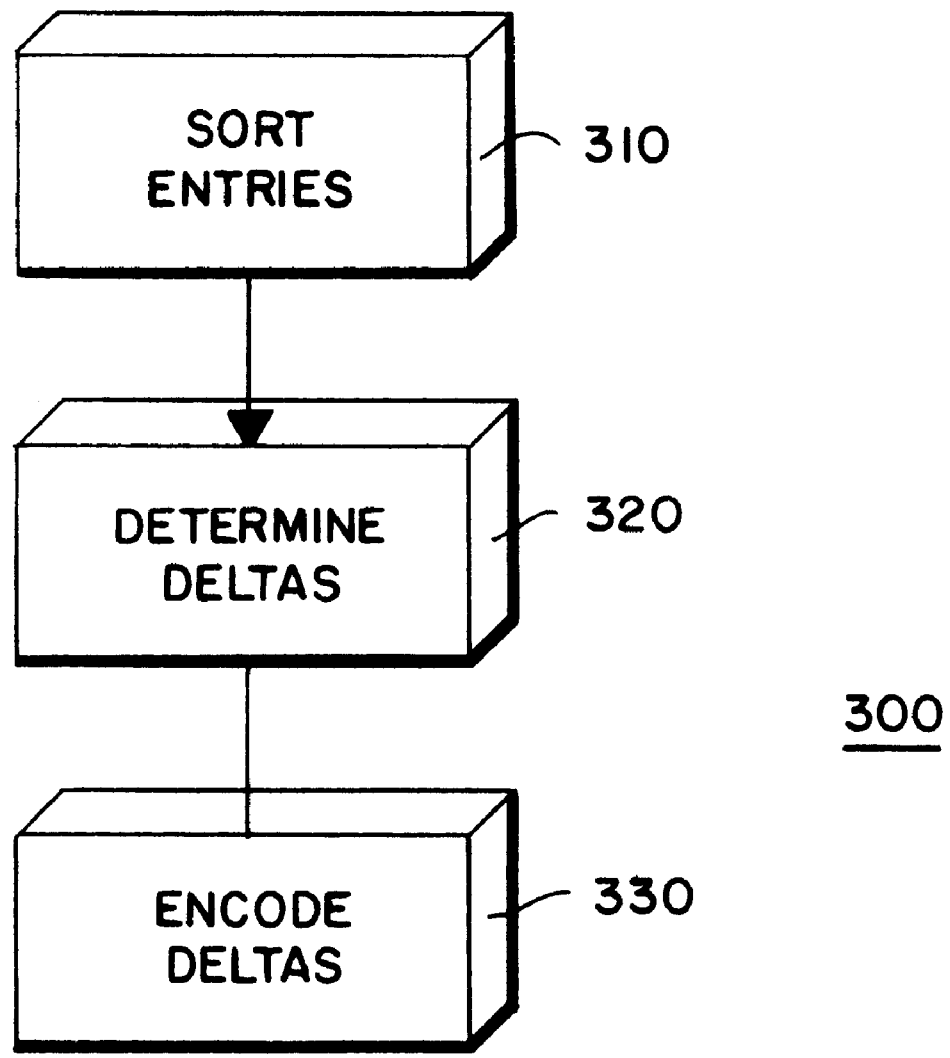
FIG. 3 is a flow diagram for further compressing images.

As shown in FIG. 3, for an alternative embodiment of the invention, further compression can be achieved by further encoding the Huffman table. In step 310, the entries of the Huffman table are sorted according to their integer values. In step 320, the logical exclusive OR (XOR) of the difference (deltas) between successive integer values is determined. Then, in step 330, Huffman encode the computed XOR differences. The encoding of the Huffman table itself can reduce the size of the table by about one half for a table of 20,000 entries.

Figure 4:
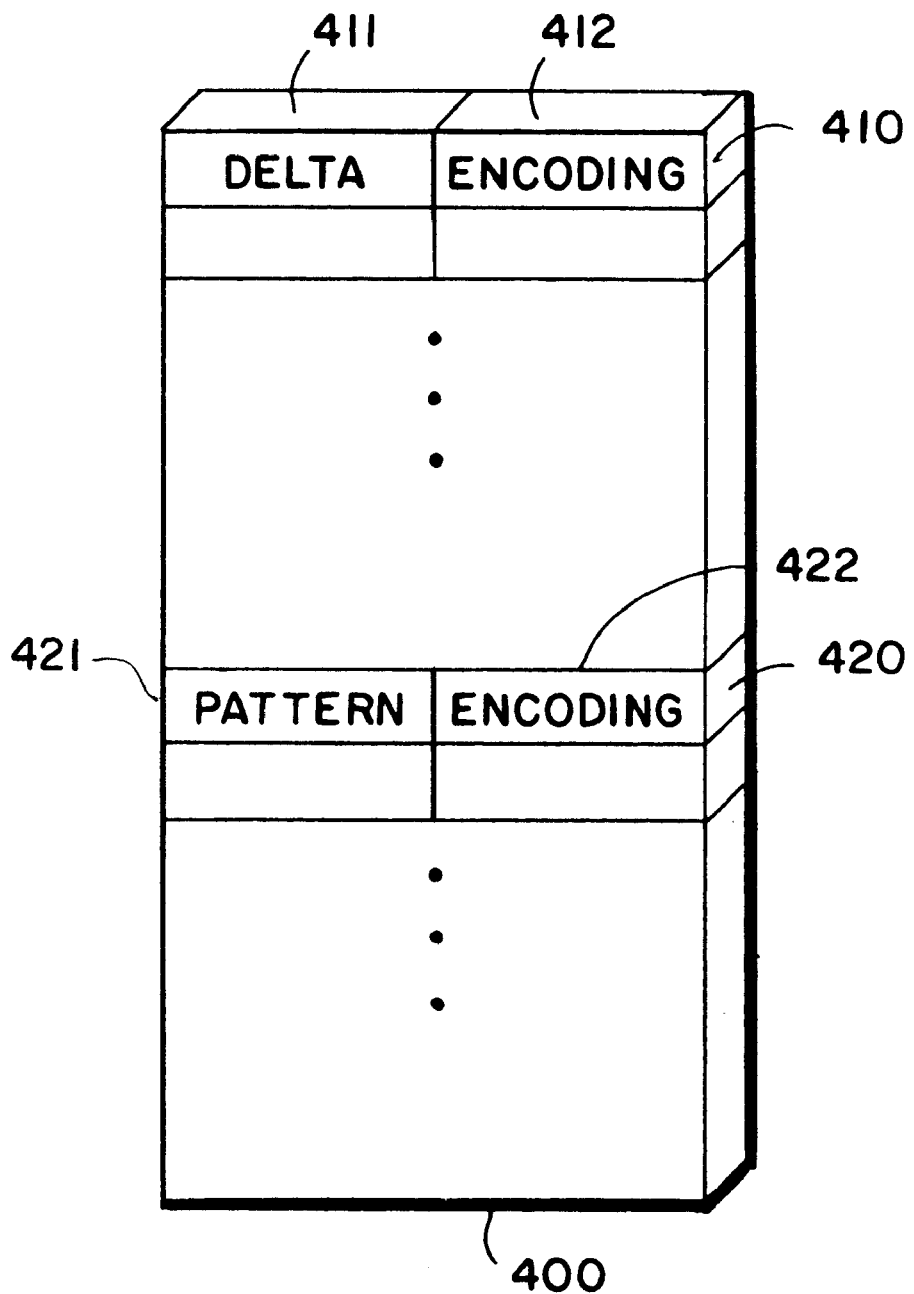
FIG. 4 is a block diagram of an encoding table produced by the processes of FIGS. 2 and 3.

As shown in FIG. 4, a final encoding table 400 comprises entries 410 of deltas 411 and the corresponding delta Huffman encodings 412, followed by entries 420 of the group patterns 421 and their encodings as determined by the processes 200 and 300. If the length of the encodings, instead of the actual encodings, is maintained in the table 400, further size reductions can be realized.

In an another alternative embodiment, the efficiency of the encoding can be improved by encoding white space more aggressively. Here the notion is to relax the regularization of the partitioning of the pixels into the groups 130. First, separate encodings are created for horizontally adjacent groups of pixels which represent white space between lines of text. Second, a special end-of-line is created to note the right edge of text. This allows for the implicit encoding of groups to the right of the end-of-mark, which are assumed to be all white space.

Third, the width of the white space typically found in the left vertical margin of an image of text can also be run-length encoded by using, for example, 1×4 dimensioned arrays of pixels such as group 131 of FIG. 1b. By ensuring that the left-most column of pixels in the left-most encoded groups is always non-white, a great deal of redundancy can be eliminated from the encoding table.

As another alternative embodiment, the methods of the present invention can be adapted to include lossy compression. In lossy compression, the encoding is not always exact. Lossy compression allows the encoded form to represent a substitute pattern which is substantially the same, but not identical to a target pattern to be encoded. Lossy compression yields relatively good quality for images which are scanned with a digitizer or scanner, since the lossy compression tends to suppress noise induced by the scanning process and produce a crisper image. Even though the time required to perform the lossy compression is slightly greater, decoding time is usually improved.

With lossy compression, the process 300 is modified as follows. During the first pass of the image 100, the table 400 is created as described above. During the second pass, if the encoder, step 250 of FIG. 2, does not find a pattern exactly matching the target pattern to be encoded in the table 400, a search is made in the table 400 for a substitute pattern which is "close" to the target pattern to be encoded, close meaning that the difference between the target pattern and its substitute pattern is small. The encoding of the substitute pattern is then used to encode the target pattern. The problem is to pick a substitute pattern which will not affect the readability of the text of the image 100.

In the preferred embodiment of the invention, the target and substitute patterns are processed as data objects in sixteen dimensional space. Using Hamming techniques, the "distance" between the shades of grey of the target and possible substitute patterns is determined. The substitute pattern with a minimal distance is selected as the substitute pattern used to encode the target pattern.

The closest pattern is determined as follows. During the identification of frequently occurring groups in step 220 of FIG. 2, the groups are hashed into buckets of a hashing table. Each group of pixel patterns is hashed several times based on subsets of pixels selected from the group. The hashing is done so that any two groups having similar pixel patterns will both be hashed into the same bucket at least once.

Figure 5:
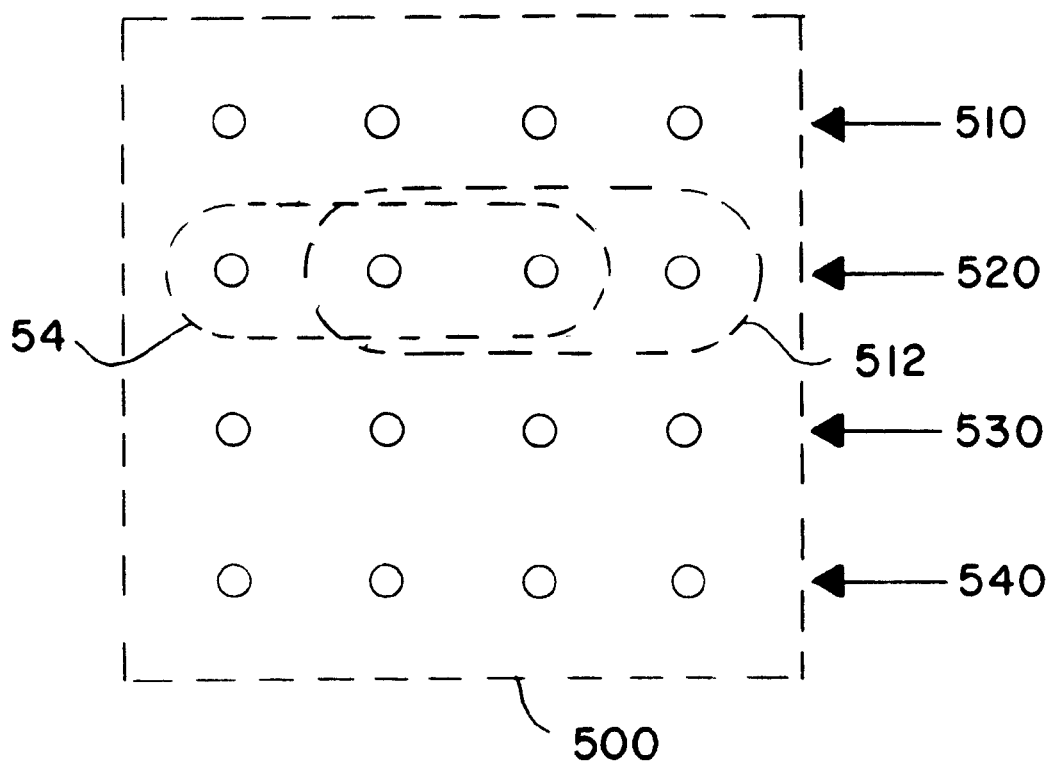
FIG. 5 is a block diagram of hash groupings for lossy compression.

For example as shown in FIG. 5, a group 500 includes 16 pixels in rows 510, 520, 530, and 540. An acceptable substitute group is a group which differs from the target group 500 by, for example, no more than three pixels for the entire group. This will require that the target group is compared with every group in the Huffman table that differs from the target group in the shades of at most three pixels.

The group 500 is hashed as follows, the first four hashes are based on the four pixels of the first row 510 combined with the four permutations of three pixels from the second row 520, e.g., 511, 512, etc. The next four hashes uses four pixels of the second row 520 combined with the permutations of three pixels from the third row 530, and so forth with wrap-around, for sixteen hashing with a different hash function being used for each group of seven pixels. Accordingly, if two groups differ in no more than three pixels, then the groups will hash to the same bucket at least once. The hashing function based on adjacent rows is arbitrary. The hashing function can also use adjacent columns, or other permutations of the rows and columns which improve performance.

The lossy compression can, alternatively, be converted to a lossless compression scheme by employing "escape" codes which are based on monitoring the occurrences of intentional erroneous encodings. The erroneous encodings are then explicitly encoded by also encoding a difference between the substitute pattern and the target pattern. For example, to encode a difference of one bit in a thirty-two bit grouping, only 5 bits are required. This is effective because a target pattern not in the table 400 consumes 4 bytes of storage, whereas the encodings for patterns in the table typically only consume one byte, and the difference can be expressed in less than one byte.

The method of the invention encodes according to a regularized grouping of pixels and using compressed Huffman tables to encode. Other groupings, for example 1×4, may also be appropriate for other arrangements of texts. Also, the invention can use other encoding schemes, such as, for example, Lempel-Ziv.

It is not intended that the present invention be limited to the specific embodiment disclosed in the above description and the associated drawings. Numerous modifications and adaptations of the invention will be apparent to those skilled in the art. Thus, it is intended by the following claims to cover all such modifications and adaptations falling within the scope of the invention.

What is claimed is:

1. A computerized method for compressing an image, the image stored as pixels in a memory of a computer, each pixel including a bit pattern indicating a gray-scale level, comprising:

grouping the pixels of the image into a plurality of groups of pixels;

identifying groups of pixels included in the plurality of groups of pixels having an identical bit pattern, without reference to a predefined library of bit patterns;

encoding the plurality of groups of pixels into encodings according to a frequency of identified groups of pixels having identical bit patterns, wherein each encoding has an integer value;

sorting the encodings according to the integer values; and encoding the difference between successive integer values.

2. The method of claim 1, further comprising:

partitioning the pixels in regularized groups of pixels.

3. The method of claim 2 wherein the regularized groups of pixels are rectangular groups of pixels.

4. The method of claim 3 wherein the rectangular groups of pixels are arranged in groups of four by four adjacent pixels.

5. The method of claim 1 wherein each bit pattern includes two bits to indicate four levels of grey-scale, and further comprising:

encoding the number of adjacent groups of pixels having all bits set to a logical zero to compress white space of the image.

6. The method of claim 1 further comprising:
selecting a substitute encoding to represent an infrequently occurring group of pixels, the substitute encoding representing a particular group of pixels having a bit pattern substantially the same as the infrequently occurring group of pixels to achieve lossy compression.

7. The method of claim 1, further comprising:
selecting a substitute encoding, which represents a particular group of pixels, to represent an infrequently occurring group of pixels; and
encoding a difference between the infrequently occurring group of pixels and the particular group of pixels.

8. The method of claim 1, further comprising the step of:
determining the frequency for a first of the plurality of groups of pixels;
wherein the frequency is determined by counting the number of groups of pixels in the first groups of pixels.

9. The method of claim 1, wherein identifying groups of pixels comprises the step of:
comparing a first of the plurality of groups of pixels with a second of the plurality of groups of pixels.

10. The method of claim 1, further comprising the step of:
storing the frequency of a first of the identified groups of pixels.

11. The method of claim 1, wherein only a single grouping of pixels is performed.

12. An article of manufacture for compressing an image, wherein the image is definable by pixels, each pixel including a bit pattern, the article of manufacture comprising:
a computer-readable storage medium; and
computer programming stored on the storage medium;
wherein the stored computer programming is configured to be readable from the computer-readable storage medium by a computer and wherein the stored computer programming includes:
programming for causing the computer to partition the pixels into a plurality of blocks, wherein each block represents a group of pixels;
programming for causing the computer to identify sets of blocks included in the plurality of blocks, each set of blocks including blocks with identical bit patterns, without reference to a predefined library of bit patterns;
programming for causing the computer to create an encoding table, wherein each entry in the encoding table corresponds to the number of blocks in a respective one of the sets of blocks;
programming for causing the computer to encode the image according to the entries in the encoding table;
programming for causing the computer to select a substitute encoding to represent an infrequently occurring block within the plurality of blocks, wherein the substitute encoding is associated with a particular block within the plurality of blocks having a bit pattern substantially the same as the infrequently occurring block; and
programming for causing the computer to encode a difference between the infrequently occurring block and the particular block.

13. The article of manufacture in claim 12, wherein a location of a first entry in the encoding table relative to a location of a second entry in the encoding table is determined by the number of blocks in the set of blocks associated with each of the first and second entries.

14. The article of manufacture in claim 12, wherein the stored computer programming further includes:
programming for causing the computer to count the number of blocks in each of the respective sets of blocks.

15. A computerized method for compressing an image, the image stored as pixels in a memory of a computer, each pixel including a bit pattern indicating a gray-scale level, comprising:
grouping the pixels of the image into a plurality of groups of pixels;
identifying groups of pixels included in the plurality of groups of pixels having an identical bit pattern, without reference to a predefined library of bit patterns;
encoding the plurality of groups of pixels into encodings according to a frequency of identified groups of pixels having identical bit patterns;
selecting a substitute encoding, which represents a particular group of pixels, to represent an infrequently occurring group of pixels; and
encoding a difference between the infrequently occurring group of pixels and the particular group of pixels.

16. The method of claim 15 further comprising:
selecting a substitute encoding to represent an infrequently occurring group of pixels, the substitute encoding representing a particular group of pixels having a bit pattern substantially the same as the infrequently occurring group of pixels to achieve lossy compression.

17. A computer system for processing an image including a plurality of pixels, each of the plurality of pixels including a bit pattern indicating a gray-scale level, the computer system comprising:
a processor; and
a memory device connected to the memory device, the memory device for storing instructions readable by the processor to thereby cause the processor to:
group the plurality of pixels of the image into a plurality of groups of pixels;
identify groups of pixels included in the plurality of groups of pixels having an identical bit pattern, without reference to a predefined library of bit patterns;
encode the plurality of groups of pixels into encodings according to a frequency of identified groups of pixels having identical bit patterns, wherein each encoding has an integer value;
sort the encodings according to the integer values; and
encode the difference between successive integer values.

18. The computer system of claim 17, wherein the memory device contains instructions readable by the processor to thereby cause the processor to:
select a substitute encoding, which represents a particular group of pixels, to represent an infrequently occurring group of pixels; and
encoding a difference between the infrequently occurring group of pixels and the particular group of pixels.

19. The computer system of claim 17, wherein the memory device contains instructions readable by the processor to thereby cause the processor to:
determine the frequency for a first of the plurality of groups of pixels;
wherein the frequency is determined by counting the number of groups of pixels in the first groups of pixels.

* * * * *